United States Patent
Kim

(10) Patent No.: US 9,865,840 B2
(45) Date of Patent: Jan. 9, 2018

(54) ORGANIC LIGHT-EMITTING DISPLAY DEVICE AND METHOD OF MANUFACTURING ORGANIC LIGHT-EMITTING DISPLAY DEVICE

(71) Applicant: LG DISPLAY CO., LTD., Seoul (KR)

(72) Inventor: YoungMi Kim, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 62 days.

(21) Appl. No.: 14/864,398

(22) Filed: Sep. 24, 2015

(65) Prior Publication Data

US 2016/0087241 A1 Mar. 24, 2016

(30) Foreign Application Priority Data

Sep. 24, 2014 (KR) .................. 10-2014-0127354

(51) Int. Cl.
*H01L 51/52* (2006.01)
*H01L 27/32* (2006.01)

(52) U.S. Cl.
CPC ...... *H01L 51/5253* (2013.01); *H01L 27/3262* (2013.01)

(58) Field of Classification Search
None
See application file for complete search history.

(56) References Cited

U.S. PATENT DOCUMENTS

| | | | | |
|---|---|---|---|---|
| 7,446,336 B2 * | 11/2008 | Yamazaki | ......... | G02F 1/136227 257/59 |
| 2001/0023661 A1 * | 9/2001 | Hiroki | ................. | H01L 51/0004 118/300 |
| 2009/0315450 A1 * | 12/2009 | Kim | .................... | H01L 27/3258 313/504 |
| 2010/0187516 A1 * | 7/2010 | Yoshizawa | ............ | H01L 51/448 257/40 |
| 2011/0079777 A1 * | 4/2011 | Akimoto | ............. | H01L 29/7869 257/43 |
| 2012/0241737 A1 * | 9/2012 | Imoto | ............... | H01L 29/78603 257/43 |
| 2013/0277667 A1 * | 10/2013 | Saito | .................... | H01L 51/5231 257/43 |
| 2015/0144943 A1 * | 5/2015 | Seo | .................... | H01L 29/78606 257/43 |

* cited by examiner

*Primary Examiner* — Lex Malsawma
(74) *Attorney, Agent, or Firm* — Birch, Stewart, Kolasch & Birch, LLP

(57) ABSTRACT

An organic light-emitting display (OLED) device and a method for manufacturing an OLED device are provided. A thin-film transistor is disposed on a lower substrate. An organic light-emitting element is disposed above the thin-film transistor and includes an anode, an organic light-emitting layer on the anode and a cathode on the organic light-emitting layer. A passivation layer is disposed on the organic light-emitting element and includes hydrogen. The hydrogen absorption layer includes at least one hydrogen absorption layer coming in contact with the top surface and/or the bottom surface of the passivation layer. The OLED device can suppress the performance of the thin-film transistor from degrading by using the hydrogen absorption layer that absorbs residual hydrogen in the passivation layer.

14 Claims, 5 Drawing Sheets

ORGANIC LIGHT-EMITTING DISPLAY DEVICE AND METHOD OF MANUFACTURING ORGANIC LIGHT-EMITTING DISPLAY DEVICE

CROSS-REFERENCE TO RELATED APPLICATIONS

This application claims the priority of Korean Patent Application No. 10-2014-0127354 filed on Sep. 24, 2014, in the Korean Intellectual Property Office, the disclosure of which is incorporated herein by reference.

BACKGROUND

Technical Field

The present disclosure relates to an organic light-emitting display device and a method of manufacturing an organic light-emitting display device. More specifically, the present disclosure relates to an organic light-emitting display device capable of reducing defects caused by hydrogen, and a method of manufacturing such an organic light-emitting display device.

Description of the Related Art

An organic light-emitting display (OLED) device is capable of producing light in its own and thus it does not require an additional light source, unlike a liquid crystal display device. Therefore, an OLED device can be made lighter and thinner. Further, an OLED device has advantages in that it is driven with low voltage to consume less power, that it represents vivid colors and has short response time, wide viewing angle and good contrast ratio (CR). For these reasons, an OLED device is currently under development as the next generation display device.

An OLED device emits light by driving an organic light-emitting element disposed in each of the sub-pixels. To drive such an organic light-emitting element in each of sub-pixels, at least one thin-film transistor (TFT) is disposed in each of the sub-pixels to be electrically connected to an organic light-emitting element.

A thin-film transistor includes a gate electrode, a source electrode, a drain electrode and a semiconductor layer. The source electrode and the drain electrode come in contact with the semiconductor layer. The gate electrode overlaps with the semiconductor layer. Upon applying a gate voltage above a certain level to the gate electrode of the thin-film transistor, a channel is formed in the semiconductor layer so that current flows between the source electrode and the drain electrode. Thin-film transistors may be sorted by the material used for the semiconductor layer into three types: a thin-film transistor using amorphous-silicon; a thin-film transistor using poly-silicon; and a thin-film transistor using oxide semiconductor. Among these, the thin-film transistor using oxide semiconductor has a higher mobility than that of the thin-film transistor using amorphous-silicon. Also, the thin-film transistor using oxide semiconductor has a lower leakage current and exhibits higher reliability than the thin-film transistor using amorphous-silicon or poly-silicon. In addition, the thin-film transistor using oxide semiconductor is advantageous over the thin-film transistor using poly-silicon in that the former exhibits a uniform distribution of the threshold voltage. In view of the above, research to apply the thin-film transistor using oxide semiconductor to an OLED device is being increasingly carried out.

In this regard, the electrical characteristics of oxide semiconductor are determined based primarily on vacancies of oxygen and hydrogen doped during the process. The concentration of carriers in the oxide semiconductor increases as vacancies of oxygen are more easily created. In addition, hydrogen reduces the oxide semiconductor, so that it significantly contributes to an increase in the concentration of carriers in the oxide semiconductor. As the oxide semiconductor has a carrier concentration section in which the mobility increases with the concentration of carriers, the characteristics of the thin-film transistor using the oxide semiconductor may be determined by adjusting the concentration of carriers appropriately.

However, hydrogen may diffuse into the oxide semiconductor layer in a variety of ways at high temperature or under electrical stress. The hydrogen diffused into the oxide semiconductor layer makes the oxide semiconductor conductive and degrades the reliability such as negative bias temperature illumination stress (NBTIS). That is, the hydrogen diffused into the oxide semiconductor layer may harm the characteristics and reliability of the thin-film transistor using oxide semiconductor. In the state of the art, it is known as an effective way to minimize the content of the hydrogen in the insulating film covering the organic light-emitting element such as a double layer of $SiN_x/SiO_2$.

For example, the insulating layer is formed by chemical vapor deposition (CVD) with silane ($SiH_4$) and ammonia ($NH_3$). During the process of forming the insulating layer by the CVD, a small amount of hydrogen may be generated from silane and ammonia. Such residual hydrogen may move in the OLED device. If the residual hydrogen diffuses into the semiconductor layer of the thin-film transistor to react with the semiconductor layer, the characteristics of the thin-film transistor may vary. As a result, the hydrogen generated during the process of forming the insulating layer may degrade the performance of the thin-film transistor as well as the performance of the OLED device.

SUMMARY

A problem associated with the related art is that hydrogen is generated during the process of forming the passivation layer and remains in the OLED device, and that the residual hydrogen diffuses toward the thin-film transistor so that the characteristics of the thin-film transistor varies and in turn the performance of the OLED device is degraded. To overcome or minimize the above and other problems associated with the related art, the inventors of the application have devised a novel structure of an OLED device capable of absorbing hydrogen included in the passivation layer, and a method of manufacturing the same.

In view of the above, an object of the present disclosure is to provide an OLED device capable of suppressing the performance of the thin-film transistor from degrading as it absorbs the hydrogen remaining in the passivation layer, and a method of manufacturing the same.

Another object of the present disclosure is to provide an OLED device having a structure capable of removing the hydrogen generated during the process of forming the passivation layer without requiring any additional equipment for removing the hydrogen in the passivation layer, and a method of manufacturing the same.

It should be noted that objects of the present disclosure are not limited to the above-described objects, and other objects of the present disclosure will be apparent to those skilled in the art from the following descriptions.

According to an aspect of the present disclosure, there is provided an OLED device capable of minimizing variations in the characteristics of a thin-film transistor using oxide semiconductor caused by the reaction with residual hydrogen by absorbing the residual hydrogen in order to prevent the residual hydrogen from diffusing into a semiconductor layer of the thin-film transistor using oxide semiconductor. A thin-film transistor is disposed on a lower substrate. An organic light-emitting element is disposed above the thin-film transistor and includes an anode, an organic light-emitting layer on the anode and a cathode on the organic light-emitting layer. A passivation layer is disposed on the organic light-emitting element and includes hydrogen. The hydrogen absorption layer includes at least one hydrogen absorption layer coming in contact with the top surface and/or the bottom surface of the passivation layer.

The hydrogen absorption layer traps active hydrogen by a metal or an alloy of metal to minimize diffusion of the active hydrogen toward the organic light-emitting element. As a result, it is possible to avoid the performance of the thin-film transistor from degrading.

Particulars in the exemplary embodiments of the present disclosure will be described in the detail description with reference to the accompanying drawings.

According to an exemplary embodiment of the present disclosure, by introducing a hydrogen absorption layer for absorbing residual hydrogen in the passivation layer, which possibly changes the characteristics of the thin-film transistor, it is possible to suppress the performance of the thin-film transistor from degrading.

Further, according to an exemplary embodiment of the present disclosure, the hydrogen in the passivation layer can be removed without any additional equipment. Thus, an OLED device can be manufactured without incurring additional cost for such additional equipment.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENTS

Figure 1A:
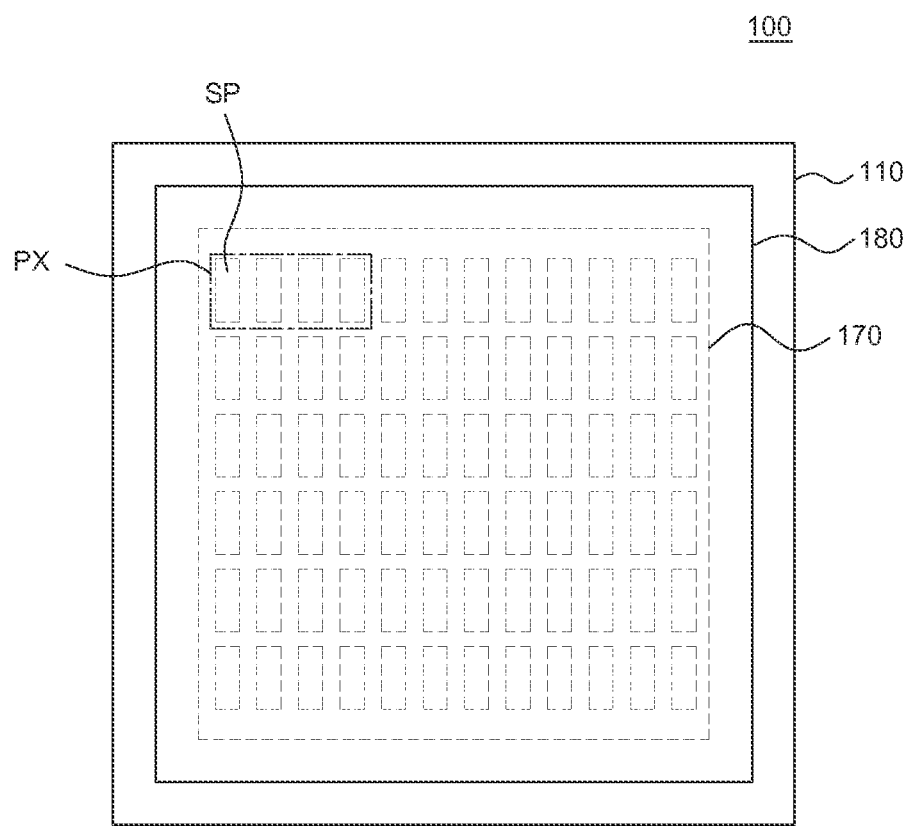
FIG. 1A is a plan view of an OLED device according to an exemplary embodiment of the present disclosure.

Advantages and features of the present disclosure and methods to achieve them will become apparent from the descriptions of exemplary embodiments herein below with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Further, in describing the present disclosure, descriptions on well-known technologies may be omitted in order not to obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," and "the," this includes a plural of that noun unless specifically stated otherwise.

For elements having specific values, they are interpreted as including error margins even without explicit statements.

In describing positional relationship, such as "an element A on an element B," "an element A above an element B," "an element A below an element $B_i$ " and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

The terms first, second and the like in the descriptions and in the claims are used for distinguishing between similar elements and not necessarily for describing a sequential or chronological order. Theses terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, exemplary embodiments of the present disclosure will be described in detail with reference to the accompanying drawings.

Figure 1B:
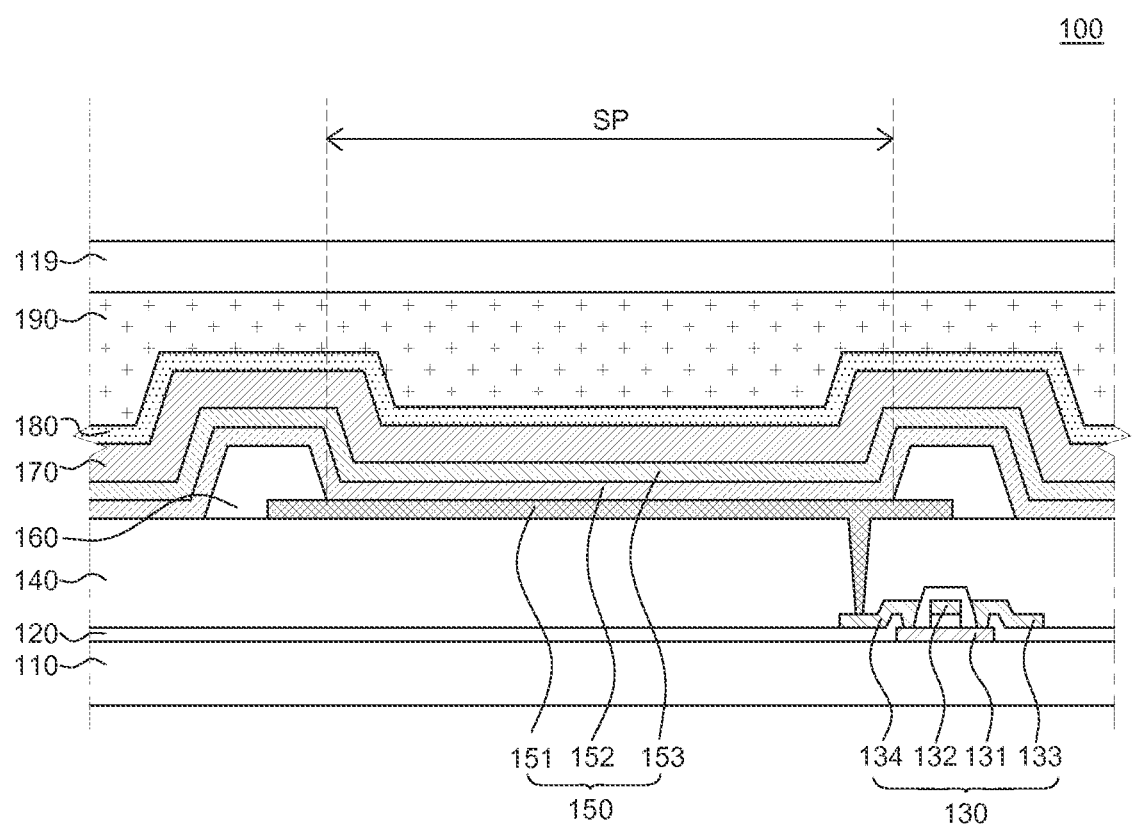
FIG. 1B is a schematic cross-sectional view of an OLED device according to an exemplary embodiment of the present disclosure.

FIG. 1A is a plan view of an OLED device according to an exemplary embodiment of the present disclosure. FIG. 1B is a schematic cross-sectional view of a single sub-pixel of an OLED device according to an exemplary embodiment of the present disclosure.

Referring to FIGS. 1A and 1B, an OLED device 100 includes a lower substrate 110, a thin-film transistor 130, an organic light-emitting element 150, a passivation layer 170, a hydrogen absorption layer 180, a bonding layer 190 and an upper substrate 119. All the components of the OLED device according to all embodiments are operatively coupled and configured. For convenience of illustration, FIG. 1A shows the passivation layer 170 and the hydrogen absorption layer 180 of the OLED device 100 only.

Referring to FIG. 1A, the OLED device 100 includes a plurality of pixels PXs. Each of pixels PXs includes a plurality of sub-pixels SPs. A sub-pixel SP is a basic light-emission unit of the OLED device 100. In a single pixel PX, different sub-pixels SPs emit light of different colors. A sub-pixel SP may include a red sub-pixel, a green sub-pixel, a blue sub-pixel and a white sub-pixel as shown in FIG. 1A, or may include a red sub-pixel, a green sub-pixel and a blue sub-pixel only.

Referring to FIG. 1B, the thin-film transistor 130 including a semiconductor layer 131, a gate electrode 132, a source electrode 133 and a drain electrode 134 is formed on the lower substrate 110 made of an insulative material. Specifically, the semiconductor layer 131 is formed on the lower substrate 110. A gate insulating layer 120 for insulating the gate electrode 132 from the semiconductor layer 131 is formed on the semiconductor layer 131 and the lower substrate 110. The gate electrode 132 is formed on the gate insulating layer 120. The source electrode 133 and the drain electrode 134 are formed on the semiconductor layer 131 and the gate insulating layer 120. Parts of the source electrode 133 and the drain electrode 134 make contact with and are electrically connected to the semiconductor layer 131. The other parts of the source electrode 133 and the drain electrode 134 are formed on the gate insulating layer 120. For convenience of illustration, among a variety of thin-film transistors of the OLED device 100, only a driving thin-film transistor is shown herein. However, the OLED device 100 may include a switching thin-film transistor as well. In addition, although the thin-film transistor 130 has a coplanar structure herein, an inverted staggered thin-film transistor may also be used.

The semiconductor layer 131 may be made of oxide semiconductor or amorphous semiconductor. The semiconductor layer 131 may absorb hydrogen. If the semiconductor layer 131 absorbs hydrogen, the threshold voltage Vth of the thin-film transistor 130 is shifted so that the mobility of the thin-film transistor 130 may increase. As a result, the characteristics of the thin-film transistor 130 are changed and thus the performance may be degraded.

An overcoating layer 140 is disposed over the gate insulating layer 120 and the thin-film transistor 130. The overcoating layer 140 covers the thin-film transistor 130 so as to planarize the area above the thin-film transistor 130. The overcoating layer 140 may be made of an insulative material.

The organic light-emitting element 150 including an anode 151, an organic light-emitting layer 152 and a cathode 153, and a bank layer 160 are formed on the overcoating layer 140. Specifically, the anode 151 for injecting holes into the organic light-emitting layer 152 is formed on the top surface of the overcoating layer 140. The organic light-emitting layer 152 is formed on the anode 151. The cathode 153 for injecting electrons into the organic light-emitting layer 152 is formed on the organic light-emitting layer 152.

If the OLED device 100 is a bottom-emission OLED device, the anode 151 may be made of, for example, transparent conductive oxide (hereinafter referred to as TCO) such as indium tin oxide (ITO), indium zinc oxide (IZO), ZnO, etc. In addition, the cathode 153 may be made of a metal material having low light transmittance.

If the OLED device 100 is a top-emission OLED device, the anode 151 may include a reflective layer and a transparent conductive layer made of a transparent conductive oxide on the reflective layer. In addition, the cathode 153 may be formed by growing a thin film made of metallic material having a low work function or may be made of transparent conductive oxide. If the cathode 153 is made of a transparent conductive oxide, multiple layers may be disposed between the cathode 153 and the organic light-emitting layer 152 so that electrons may travel via the cathode 153. For example, a metal doping layer may be disposed between the organic light-emitting layer 152 and the cathode 153. In addition, an organic buffer layer may be disposed between the organic light-emitting layer 152 and the metal doping layer. The bank layer 160 is formed so that it covers a part of the organic light-emitting layer 152 and the anode 151 to define a light-emitting region of each of sub-pixels SPs.

The passivation layer 170 is formed so that it conforms to the cathode 153. That is, the passivation layer 170 is formed along the shape of the top surface of the cathode 153. The passivation layer 170 covers the organic light-emitting element 150. For example, the thickness of the passivation layer 170 may be 10 µm or less.

Referring to FIG. 1A, the passivation layer 170 overlaps all of the plurality of sub-pixels SPs.

The passivation layer 170 may cover the cathode 153. The passivation layer 170 may protect the organic light-emitting element 150 from moisture or oxygen permeating from the outside of the OLED device 100. The passivation layer 170 may be made of a variety of organic films or inorganic films and may have a single organic film deposition structure, a single inorganic film deposition structure or organic film/inorganic film alternation structure or multiple-film deposition structure, etc. The passivation layer 170 may be, for example, a film formed by depositing silicon nitride ($SiN_x$), silicon oxide ($SiO_x$), etc.

The passivation layer 170 is formed by chemical vapor deposition (CVD) using a gas containing hydrogen, e.g., silane ($SiH_4$) and ammonia ($NH_3$). Accordingly, hydrogen may be generated during the process of forming the passivation layer 170. Such hydrogen may be diffused into the passivation layer 170 to be included therein. In this regard, hydrogen includes hydrogen atoms (H) as well as hydrogen molecules ($H_2$). Residual hydrogen included in the passivation layer 170 may travel in the OLED device 100. The residual hydrogen may be diffused into the semiconductor layer 131 of the thin-film transistor 130, and the characteristics of the thin-film transistor 130 may be changed. As a result, the hydrogen generated during the process of forming the passivation layer may degrade the performance of the thin-film transistor as well as the performance of the OLED device. Therefore, it is necessary to remove the residual hydrogen in the passivation layer.

The hydrogen absorption layer 180 or any other structure implemented to perform a similar role is disposed on the top surface of the passivation layer 170. Specifically, the hydrogen absorption layer 180 comes in contact with the top surface of the passivation layer 170 and covers the passivation layer 170. The thickness of the hydrogen absorption layer 180 may be 5,000 Å or less. The hydrogen absorption layer 180 is merely an example, and other structure or object that can absorb hydrogen or reduce (minimize) diffusion may be implemented in a variety of forms with different characteristics. It may be determined taking into account the characteristics of the oxide semiconductor of the thin-film transistor or the characteristics of a finished display device such as the size and use.

Referring to FIG. 1A, the hydrogen absorption layer 180 overlaps the passivation layer 170 and the area of the hydrogen absorption layer 180 is larger than that of the passivation layer 170. That is, the hydrogen absorption layer 180 covers the passivation layer 170 when viewed from the above as shown in FIG. 1A. Accordingly, the hydrogen absorption layer 180 may cover the top surface and side surfaces of the passivation layer 170.

In order to absorb the residual hydrogen in the passivation layer 170, the hydrogen absorption layer 180 may contain an inorganic material that absorbs hydrogen, e.g., hydrogen atoms (H) and hydrogen molecules ($H_2$). The inorganic material of the hydrogen absorption layer 180 may include at least one of a metal, a mixture containing a metal and a compound containing a metal. For example, the hydrogen absorption layer 180 may include: a metal; a mixture of a metal; a compound of a metal; a metal and a mixture of a metal; a metal and a compound of a metal; a mixture of a metal and a compound of a metal; or a metal, a mixture of a metal and a compound of a metal. The metal may be one of an alkali metal, an alkaline earth metal, a rare earth metal, a titanium (Ti) family metal and a post-transition metal. In addition, the metal may be particles having a diameter from several to tens of nanometers (nm). For example, the metal may be particles having a diameter of 100 nm or less.

The inorganic material of the hydrogen absorption layer 180 may absorb hydrogen in a variety of ways. Specifically, the inorganic material of the hydrogen absorption layer 180 may absorb hydrogen via chemical reaction with the residual hydrogen or by trapping the residual hydrogen in the gaps between elements of the inorganic material. To facilitate such a variety of ways, the physical, chemical and structural characteristics of the inorganic material and/or the hydrogen absorption layer 180 can be adjusted variously.

The inorganic material of the hydrogen absorption layer 180 reacts with the residual hydrogen in the passivation layer 170 to generate a hydrogen compound. Accordingly, a hydrogen compound produced as a result of reaction between the inorganic material of the hydrogen absorption layer 180 and the residual hydrogen in the passivation layer 170 may be included in the hydrogen absorption layer 180. That is, the hydrogen absorption layer 180 may include the hydrogen compound as well as the inorganic material. The hydrogen compound in the hydrogen absorption layer 180 may be produced via the reaction expressed as Chemical Formula 1 below:

$$Me+(X/2)H_2 \rightarrow MeH_x+Heat \qquad \text{[Chemical Formula 1]}$$

Formula 1 expresses the process that the inorganic material of the hydrogen absorption layer 180 reacts with the residual hydrogen in the passivation layer 170 to produce a hydrogen compound ($MeH_x$), where Me denotes a metal. Unfortunately, a metal compound or a metal mixture, as well as a metal, may also react with the hydrogen as expressed in Chemical Formula 1, to form a metal-hydrogen compound.

Since the chemical reaction in Chemical Formula 1 is an exothermic reaction, the forward reaction of the chemical reaction in Chemical Formula 1 may more actively occur as the temperature of the reaction environment is lower. That is, it is easier to produce the hydrogen compound at a lower temperature of the reaction environment. Accordingly, a high temperature is not required for absorbing the hydrogen by the hydrogen absorption layer 180. It is noted that the idea of absorbing the hydrogen by the hydrogen absorption layer 180 is advantageous since the organic light-emitting layer 152 is vulnerable to heat.

The reaction of which the hydrogen that was absorbed by the hydrogen absorption layer 180 exits the hydrogen absorption layer 180 again is the reverse reaction of that expressed in Chemical Formula 1 and is an endothermic reaction; and thus it does not occur in the normal operating environment of the OLED device. Accordingly, the hydrogen absorbed by the hydrogen absorption layer 180 can be kept therein. That is, the hydrogen included in the hydrogen absorption layer 180 does not diffuse into other elements of the OLED device 100 according to the exemplary embodiment of the present disclosure.

The inorganic material of the hydrogen absorption layer 180 may transmit light incident thereon. For example, the transmittance of the hydrogen absorption layer 180 with respect to light incident thereon may be 50% or higher. For example, the transmittance of the hydrogen absorption layer 180 with respect to light incident thereon may be 70% or higher. The light transmission property of the hydrogen absorption layer 180 is advantageous for obtaining the transmittance and increasing the luminous efficiency of a top-emission OLED device.

The bonding layer 190 is disposed on the hydrogen absorption layer 180. The top surface of the bonding layer 190 comes in contact with the upper substrate 119 and may be a flat surface. The bonding layer 190 attaches the lower substrate 110 to the upper substrate 119 facing the lower substrate 110. To this end, the bonding layer 190 contains an adhesive material. Specifically, the bonding layer 190 may be made of a liquid adhesive material or an adhesive film. For example, the bonding layer 190 may be made of a resin, an epoxy, an acryl, etc. In some embodiments, the bonding layer 190 may be formed as a single piece integrated with the hydrogen absorption layer 180. Accordingly, the hydrogen absorption layer 180 may contain an adhesive material and may be disposed directly on the top surface of the passivation layer 170.

The hydrogen produced during the process of forming the passivation layer 170 and residing in the passivation layer 170 may travel in the OLED device 100. Further, the semiconductor layer 131 may absorb the residual hydrogen, so that the performance of the thin-film transistor 130 may be degraded. To avoid this, in the OLED device 100 according to the exemplary embodiment of the present disclosure, the hydrogen absorption layer 180 containing an inorganic material for absorbing hydrogen comes in contact with the top surface of the passivation layer 170. Accordingly, the hydrogen absorption layer 180 produces a hydrogen compound by reacting with the residual hydrogen that traveled from the passivation layer 170, to absorb the residual hydrogen traveling from the passivation layer 170 to the thin-film transistor 130. As a result, the OLED device 100 can avoid the performance of the thin-film transistor 130 from degrading due to the traveling residual hydrogen by virtue of the hydrogen absorption layer 180.

In some embodiments, the hydrogen absorption layer 180 may further include a getter in addition to the inorganic material for absorbing hydrogen. The getter may be particles for absorbing moisture and gas. As will be appreciated, the physical, chemical and structural characteristics of a material for the getter may be adjusted depending on the performance of the getter designed to absorb hydrogen and suppress diffusion.

Figure 2:
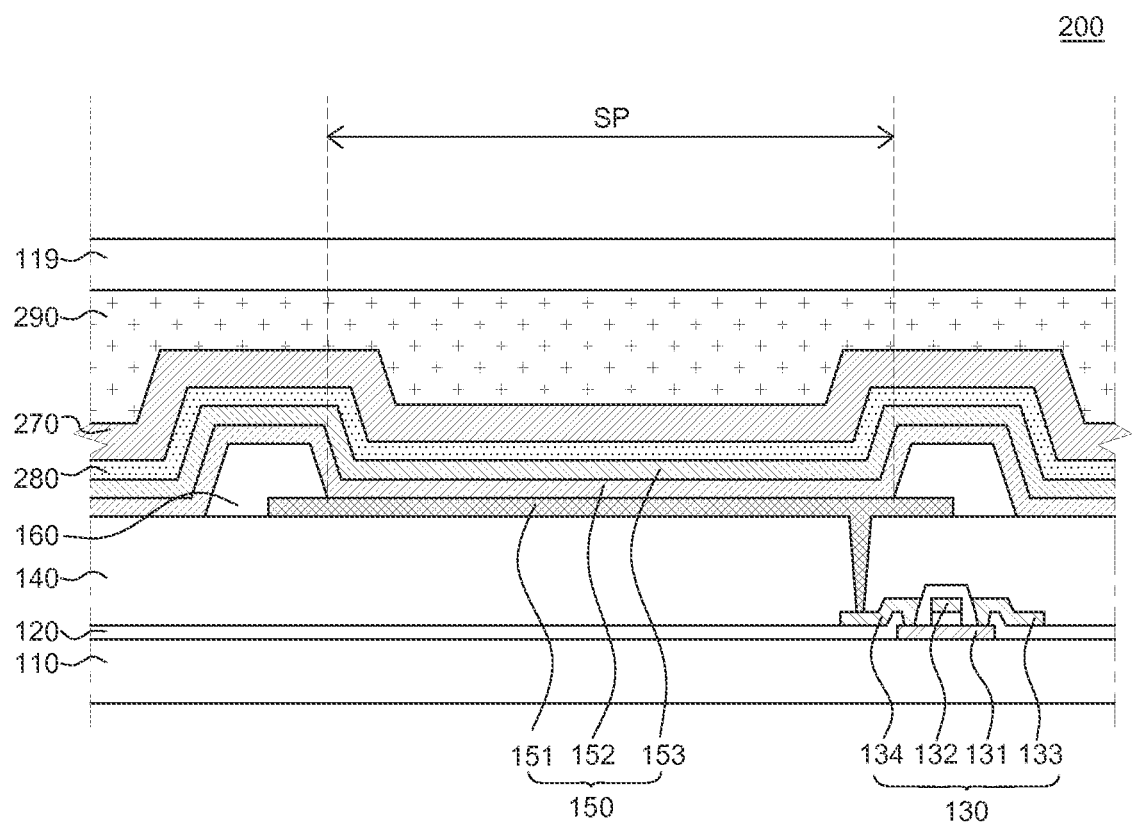
FIG. 2 is a schematic cross-sectional view of a single sub-pixel of an OLED device according to another exemplary embodiment of the present disclosure.

FIG. 2 is a schematic cross-sectional view of a single sub-pixel of an OLED device according to another exemplary embodiment of the present disclosure. The OLED device 200 shown in FIG. 2 is substantially identical to the OLED device 100 shown in FIG. 1B except for the difference in the locations of a passivation layer 270 and a hydrogen absorption layer 280; and, therefore, the redundant description will not be made or will be brief.

Referring to FIG. 2, the hydrogen absorption layer 280 is disposed on the bottom surface of the passivation layer 270. That is, the hydrogen absorption layer 280 is formed on the cathode 153 so that it conforms to the cathode 153, and then the passivation layer 270 is formed on the hydrogen absorption layer 280 so that it conforms to the hydrogen absorption layer 280. The hydrogen absorption layer 280 comes in contact with the bottom surface of the passivation layer 270 and is overlapped with the passivation layer 270. The area of the hydrogen absorption layer 280 may be larger than the area of the passivation layer 270. Accordingly, the bonding layer 290 is disposed on the passivation layer 270 and attaches the lower substrate 110 to the upper substrate 119.

In the OLED device 200 according to this exemplary embodiment of the present disclosure, the hydrogen absorption layer 280 comes in contact with the bottom surface of the passivation layer 270. Accordingly, the hydrogen absorption layer 280 is disposed between the passivation layer 270 and the thin-film transistor 130. In this configuration, the hydrogen absorption layer 280 between the passivation layer 270 and the thin-film transistor 130 can more efficiently absorb the residual hydrogen traveling to the semiconductor layer 131.

In some embodiments, a hydrogen absorption layer may be formed on the top surface of the passivation layer 270 in addition to the bottom surface of the passivation layer 270. That is, the hydrogen absorption layer 180 disposed on the top surface of the passivation layer 170 as shown in FIG. 1B may be employed by the OLED device 200 shown in FIG. 2 as well. Accordingly, the hydrogen absorption layers 180 and 280 may be disposed on the top and bottom surfaces of the passivation layer 270, respectively, so that the hydrogen absorption layers 180 and 280 may cover the side surfaces of the passivation layer 270 as well. As a result, the hydrogen absorption layers 180 and 280 may cover the top surface, the bottom surface and the side surfaces of the passivation layer 270.

As the hydrogen absorption layers 180 and 280 cover the top surface and the bottom surface of the passivation layer 170 and 270 or the top surface, the bottom surface and the side surfaces of the passivation layer 170 and 270, they can absorb more residual hydrogen in the passivation layer 170 and 270. As a result, it is possible to further reduce the chances that the residual hydrogen reaches the semiconductor layer 131 of the thin-film transistor 130.

Figure 3:
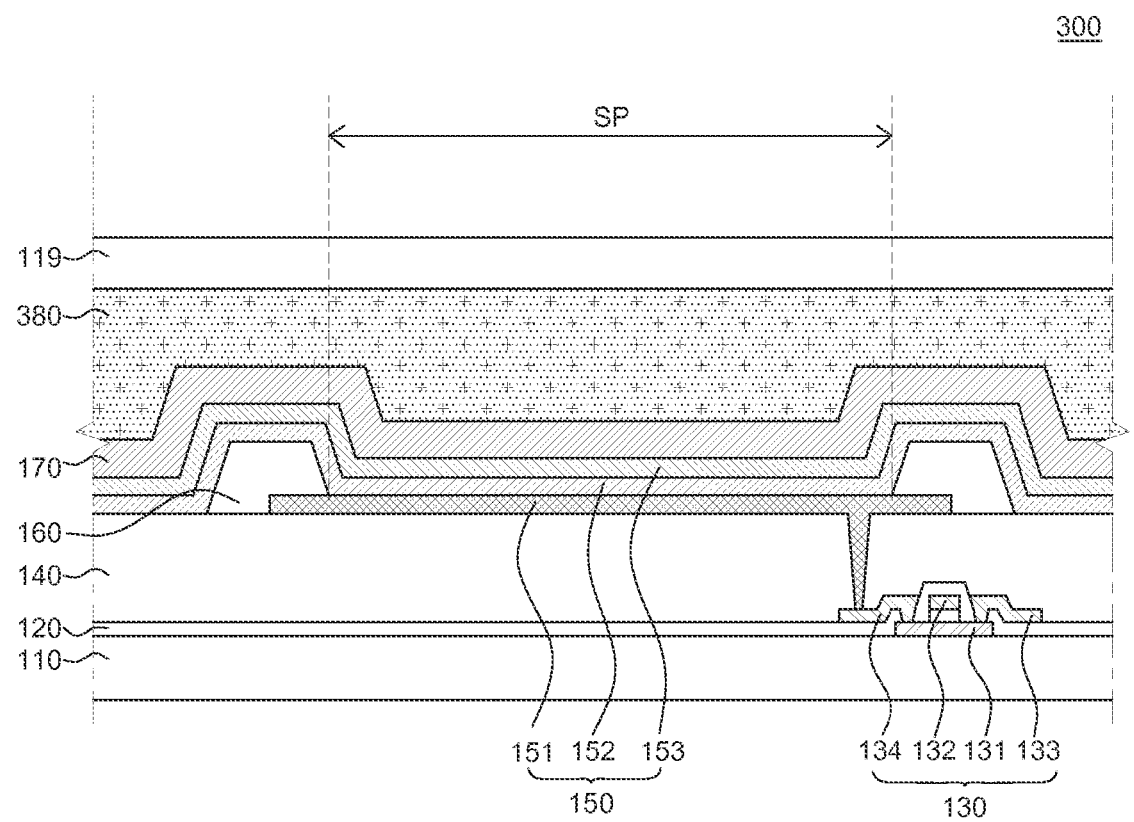
FIG. 3 is a schematic cross-sectional view of a single sub-pixel of an OLED device according to yet another exemplary embodiment of the present disclosure.

FIG. 3 is a schematic cross-sectional view of a single sub-pixel of an OLED device according to yet another exemplary embodiment of the present disclosure. The OLED device 300 shown in FIG. 3 is substantially identical to the OLED device 100 shown in FIG. 1B except for a material of a hydrogen absorption layer 380; and, therefore, the redundant description will not be made or will be brief.

Referring to FIG. 3, the hydrogen absorption layer 380 comes in contact with the top surface of the passivation layer 170 and further contains an adhesive material. That is, the hydrogen absorption layer 380 may contain an inorganic material for absorbing hydrogen as well as an adhesive material. The thickness of the hydrogen absorption layer 380 containing the adhesive material may range from 1 µm to 10 µm.

In the OLED device 300 according to this exemplary embodiment of the present disclosure, the hydrogen absorption layer 380 may absorb residual hydrogen in the passivation layer 170 and also attach the upper substrate 119 to the lower substrate 110. That is, since the hydrogen absorption layer 380 may absorb hydrogen as well as attaching the substrates to each other, the OLED device 300 can remove the residual hydrogen with a single layer rather than a plurality of layers consisting of a hydrogen absorption layer and a bonding layer. Accordingly, the OLED device 300 includes the hydrogen absorption layer 380 of a single layer and thus the manufacturing time can be shortened.

Figure 4:
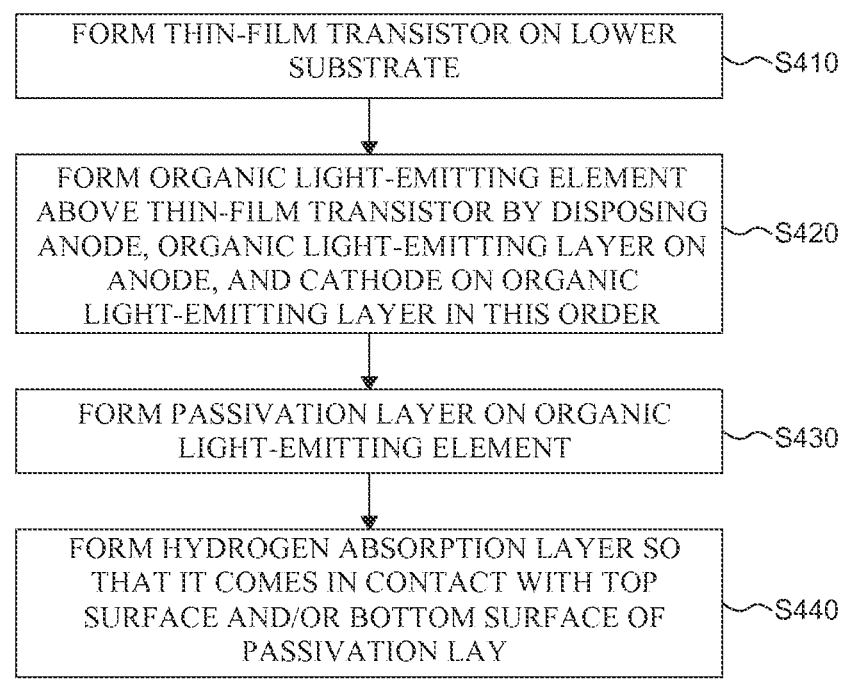
FIG. 4 is a flowchart for illustrating a method of manufacturing an OLED display according to an exemplary embodiment of the present disclosure.

FIG. 4 is a flowchart for illustrating a method of manufacturing an OLED display according to an exemplary embodiment of the present disclosure. In the following descriptions, processes of forming the passivation layer 170 and the hydrogen absorption layer 180 will be mainly described with reference to FIGS. 1A and 1B.

Initially, the thin-film transistor 130 is formed on the lower substrate 110 (step S410).

Referring to FIG. 1B, the semiconductor layer 131 is formed on the lower substrate 110. The gate insulating layer 120 is formed on the semiconductor layer 131 and the lower substrate 110. The gate electrode 132 is formed on the gate insulating layer 120. The source electrode 133 and the drain electrode 134 are formed on the semiconductor layer 131 and the gate insulating layer 120, to form the thin-film transistor 130.

Subsequently, the organic light-emitting element 150 is formed above the thin-film transistor 130 by forming the anode 151, the organic light-emitting layer 152 on the anode 151, and the cathode 153 on the organic light-emitting layer 152 in this order (step S420).

Referring to FIG. 1B, the organic light-emitting element 150 is formed in such a manner that the anode 151 is formed such that it is electrically connected to the drain electrode 134 via a contact hole in the overcoating layer 140. The bank layer 160 is formed such that it covers ends of the anode 151, and the organic light-emitting layer 152 and the cathode 153 are formed on the anode 151 and the bank layer 160.

Subsequently, the passivation layer 170 is formed on the organic light-emitting element 150 (step S430).

The passivation layer 170 is formed by the CVD using silane and ammonia. As a result, hydrogen may be generated from the silane and ammonia used during the process of forming the passivation layer 170 by the CVD. The hydrogen thus generated may be included in the passivation layer 170 by diffusion.

Subsequently, the hydrogen absorption layer(s) 180 is formed such that it comes in contact with at least one of the top surface and the bottom surface of the passivation layer 170 (step S440).

In the example shown in FIG. 1B, the hydrogen absorption layer 180 comes in contact with the top surface of the passivation layer 170. The hydrogen absorption layer 180 contains an inorganic material for absorbing hydrogen.

The hydrogen absorption layer 180 may be formed by performing the CVD, sputtering or thermal evaporation with an inorganic material. Specifically, if the hydrogen absorption layer 180 comes in contact with the top surface of the passivation layer 170 as shown in FIG. 1B, the hydrogen absorption layer 180 may be formed by performing the CVD, sputtering or thermal evaporation on the top surface of the passivation layer 170 with an inorganic material.

In some embodiments, forming the hydrogen absorption layer 180 may include dispersing or doping an inorganic material into an organic material. Specifically, the hydrogen absorption layer 180 may be formed by disposing an organic material on the passivation layer 170 and dispersing or doping an inorganic material for absorbing hydrogen into the organic material. The organic material may be the same one as that used for the organic light-emitting layer 152. The thickness of the hydrogen absorption layer 180 thus formed may be 1 µm or less.

In some embodiments, the hydrogen absorption layer 280 may come in contact with the bottom surface of the passivation layer 270 as shown in FIG. 2. In this example, the hydrogen absorption layer 280 may be formed by performing the CVD, sputtering or thermal evaporation on the top surface of the cathode 153 with an inorganic material, and the passivation layer 270 may be formed on the hydrogen absorption layer 280. Alternatively, the hydrogen absorption layer 280 may be formed by disposing an organic material on the top surface of the cathode 153 and dispersing or doping an inorganic material into the organic material, and the passivation layer 270 may be formed on the hydrogen absorption layer 280.

In some embodiments, the hydrogen absorption layers 180 and 280 may be formed so that they come in contact with the top surface and the bottom surface of the passivation layer 270, respectively. Specifically, the hydrogen absorption layer 280 may be disposed by performing the CVD, sputtering or thermal evaporation on the cathode 153 with an inorganic material as shown in FIG. 2. The passivation layer 270 may be disposed on the hydrogen absorption layer 280, and the hydrogen absorption layer 180 may be disposed by performing the CVD, sputtering or thermal evaporation on the passivation layer 270 with an inorganic material as shown in FIG. 1B. Alternatively, the hydrogen absorption layer 280 may be formed by disposing an organic material on the cathode 153 and dispersing or doping an inorganic material for absorbing hydrogen into the organic material as shown in FIG. 2. The passivation layer 270 may be disposed on the hydrogen absorption layer 280, and the hydrogen absorption layer 180 may be formed by disposing an organic material on the passivation layer 270 and dispersing or doping an inorganic material for absorbing hydrogen into the organic material as shown in FIG. 1B. Subsequently, referring to FIG. 1B, the bonding layer 190 may be disposed on the upper substrate 119 and the upper substrate 119 may be attached to the lower substrate 110. By doing so, the bonding layer 190 disposed on the bottom surface of the upper substrate 119 may be disposed on the hydrogen absorption layer 180.

In some embodiments, the hydrogen absorption layer 380 containing an adhesive material may come in contact with the top surface of the passivation layer 170 as shown in FIG. 3. The material for the hydrogen absorption layer 380 may be produced by using a vacuum defoaming agitator. Specifically, the vacuum defoaming agitator agitates and defoams an inorganic material for absorbing hydrogen and an adhesive material by revolution and rotation at high speed in vacuum, to produce the material for the hydrogen absorption layer 380. Then, the material for the hydrogen absorption layer 380 produced by the vacuum defoaming agitator is disposed on the upper substrate 119, and the upper substrate 119 is attached to the lower substrate 110, to manufacture the OLED device 300.

In the method of manufacturing the OLED device according to an exemplary embodiment of the present disclosure, the hydrogen absorption layer 180 comes in contact with the top surface of the passivation layer 170. By virtue of the hydrogen absorption layer 180, it is possible to efficiently remove the residual hydrogen even without requiring additional equipment or without incurring additional cost, so that the residual hydrogen in the passivation layer 170 does not affect the mobility of the thin-film transistor 130. In particular, since the hydrogen absorption layer 180 may be formed using the CVD, sputtering, thermal evaporation, etc., the OLED device 100 may include an element for absorbing the residual hydrogen in the passivation layer 170 without incurring excessive cost.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical ideas of the present disclosure are not limited by the exemplary embodiments. The scope of protection sought by the present disclosure is defined by the appended claims and all equivalents thereof are construed to be within the true scope of the present disclosure.

The invention claimed is:

1. An organic light-emitting display (OLED) device, comprising:
   a lower substrate comprising a thin-film transistor and an organic light-emitting element above the thin-film transistor;
   a passivation layer disposed above the lower substrate so that the passivation layer covers the organic light-emitting element, the passivation layer containing hydrogen; and
   at least one hydrogen absorption layer coming in contact with a top surface and/or a bottom surface of the passivation layer and containing a metal-hydrogen compound so that hydrogen exiting from the passivation layer does not diffuse into the thin-film transistor.

2. The OLED device of claim 1,
   wherein a metal of the metal-hydrogen compound comprises at least one of an alkali metal, an alkaline earth metal, a rare earth metal, a titanium (Ti) based metal, a post-transition metal, and a compound thereof.

3. The OLED device of claim 2, wherein the metal is dispersed in the at least one hydrogen absorption layer in the form of particles having a diameter of several to tens of nanometers.

4. The OLED device of claim 1, wherein a metal of the metal-hydrogen compound is doped into the at least one hydrogen absorption layer.

5. The OLED device of claim 1, claim 2, further comprising:
   an upper substrate facing the lower substrate,
   wherein the at least one hydrogen absorption layer contains an adhesive material to attach the upper substrate to the lower substrate, and comes in direct contact with the top surface of the passivation layer.

6. The OLED device of claim 1, wherein the at least one hydrogen absorption layer further comprises a getter.

7. The OLED device of claim 1, wherein the at least one hydrogen absorption layer overlaps the passivation layer, and an area of the at least one hydrogen absorption layer is larger than an area of the passivation layer.

8. The OLED device of claim 1, wherein the thin-film transistor comprises a semiconductor layer, and the semiconductor layer is made of a material that reacts with the hydrogen at a room temperature.

9. The OLED device of claim 8, wherein the semiconductor layer is made of oxide semiconductor.

10. The OLED device of claim 1, wherein the at least one hydrogen absorption layer covers side surfaces of the passivation layer.

11. The OLED device of claim 10, wherein the at least one hydrogen absorption layer further comprises a first hydrogen absorption layer and a second hydrogen absorption layer, and wherein the first hydrogen absorption layer and the second hydrogen absorption layer each are on the top and bottom surfaces of the passivation layer.

12. An organic light-emitting display (OLED) device, comprising:
   upper and lower substrates facing each other with a bonding layer therebetween, the lower substrate comprising a thin-film transistor and an organic light-emitting element; and
   a hydrogen absorption layer disposed between the bonding layer and the thin-film transistor,
   wherein the hydrogen absorption layer suppresses a semiconductor layer of the thin-film transistor from reacting with hydrogen, and
   wherein the hydrogen absorption layer contains a metal-hydrogen compound.

13. The OLED device of claim 12, wherein a transmittance of the hydrogen absorption layer with respect to light incident thereon is 50% or higher.

14. The OLED device of claim 12, wherein the semiconductor layer is made of oxide semiconductor.

* * * * *